(12) United States Patent
Kocher

(10) Patent No.: US 6,512,389 B1
(45) Date of Patent: Jan. 28, 2003

(54) APPARATUS FOR USE IN AN ELECTRONIC COMPONENT TEST INTERFACE HAVING MULTIPLE PRINTED CIRCUIT BOARDS

(75) Inventor: Douglas Kocher, Portland, OR (US)

(73) Assignee: AQL Manufacturing Services, Inc., Wilsonville, OR (US)

( * ) Notice: Subject to any disclaimer, the term of this patent is extended or adjusted under 35 U.S.C. 154(b) by 12 days.

(21) Appl. No.: 09/715,671

(22) Filed: Nov. 17, 2000

(51) Int. Cl.⁷ .............................................. G01R 31/02
(52) U.S. Cl. ...................................... 324/755; 324/761
(58) Field of Search .................................. 324/754, 755, 324/758, 760, 761; 439/70, 72, 66, 591, 245

(56) References Cited

U.S. PATENT DOCUMENTS

| | | | |
|---|---|---|---|
| 4,443,756 A | * 4/1984 | Lightbody et al. | 324/758 |
| 4,544,888 A | * 10/1985 | Kvaternik | 324/758 |
| 4,724,383 A | * 2/1988 | Hart | 324/754 |
| 5,174,763 A | * 12/1992 | Wilson | 439/245 |
| 5,502,397 A | * 3/1996 | Buchanan | 324/754 |
| 5,534,787 A | * 7/1996 | Levy | 324/754 |
| 6,046,597 A | * 4/2000 | Barabi | 324/755 |
| 6,084,421 A | 6/2000 | Swart | |
| 6,208,155 B1 | * 3/2001 | Barabi et al. | 324/754 |
| 6,208,158 B1 | * 3/2001 | Schein et al. | 324/761 |
| 6,229,322 B1 | * 5/2001 | Hembree | 324/755 |
| 6,359,452 B1 | * 3/2002 | Mozzetta | 324/754 |

* cited by examiner

Primary Examiner—Kamand Cuneo
Assistant Examiner—Minh N. Tang
(74) Attorney, Agent, or Firm—Ipsolon LLP

(57) ABSTRACT

An apparatus for significantly improving the speed at which test signals are transferred between a mother board and daughter board connection, and for providing a signal that has improved electrical purity by reducing signal impurities such as capacitance and inductance. Test probes are retained in holes formed in one of the boards rather than in a probe block or standard male/female connector. The upper ends of the test probes make electrical contact with associated test points on the daughter board. The opposite ends of the test probes do not probe pads on the outer surface of the mother board and instead make electrical contact within the board itself. The distance between the facing surfaces of the mother and daughter board is thereby significantly reduced, significantly shortening the electrical path and significantly decreasing parasitic components.

19 Claims, 3 Drawing Sheets

APPARATUS FOR USE IN AN ELECTRONIC COMPONENT TEST INTERFACE HAVING MULTIPLE PRINTED CIRCUIT BOARDS

FIELD OF THE INVENTION

This invention relates to devices used for testing electronic components in a mother board/daughter board configuration and the general application of connecting two printed circuit boards (PCBs) in parallel configuration for improving the speed, purity and accuracy of electrical test signals used during component testing.

BACKGROUND OF THE INVENTION

Electronic components such as microprocessor devices, multi-chip packages, memory chip packages, field programmable gate arrays (FPGAs), dynamic random access memory (DRAM) and the like are utilized in packages such as ball grid arrays (BGAs) and chip scale packages (CSPs). These packages are well known in the art and are being used more and more frequently because they offer greater circuit density and higher pin counts than other packages such as quad flat packs (QFPs) and pin grid arrays (PGAs). Packages such as BGAs and CSPs also offer better electrical performance due to the shortened circuit path from the device die to the printed circuit board.

Prior to their being installed onto PCBs, electronic components such as those mentioned above must be thoroughly tested to ensure that the components are electronically correct, and are functioning properly according to specifications. The same is true of other electronic components such as the PCBs that are used to test other components. In an idealized testing regime the goal is to have the component (whether the "component" is a PCB or, for example, a BGA) behave as if it were directly connected to the adjacent PCB and to eliminate any possible fault indications caused by the testing process itself. For instance, in many components certain switches and circuits are designed to react in a specific way to electrical phenomena such as a voltage drop. However, if during the testing process a voltage drop occurs unintentionally, for instance, due to an imperfect signal, a switch may react to the drop in voltage as it normally would. While this may be the proper reaction, in the context of the test it may be interpreted as a fault reaction. In other words, the test regime did not account for a voltage drop due to an imperfect signal. As a result, an error indication is noted where in fact there was no error.

Signal errors and imperfections could be eliminated if the components were directly connected to the PCBs such as by soldering. That, however, is obviously impractical for a test process since the component could not be readily separated from the test board. The test equipment must therefore be designed to minimize signal errors and imperfections while allowing for economical testing processes.

By way of illustration, and with reference to one typical interface that is used to test components, devices called "test sockets" are used as part of the testing procedure and are intended to help ensure that test results are not flawed by errors that occur during the testing process as a result of the test equipment itself. The test sockets define an interface device that holds the component (such as a BGA) and allows the component to be interfaced with a test machine that is programmed to send electric test signals to the component. In this testing procedure the component being tested is referred to as the "device under test" or "DUT." There are a wide variety of test sockets in use today. Nonetheless, in most instances the test socket comprises a box like compartment that is designed to hold the integrated circuit package such as a BGA in a desired position. For purposes of illustration, the following description refers to a BGA package. It will be understood that the description applies just as well to other packages.

The test socket typically has an internal compartment or window into which the BGA fits. The lower portion of the compartment is called a probe plate. It has a "footprint" of holes drilled through it that matches the array of test points on the BGA. A spring probe is retained in each hole in the probe plate—there is a spring probe associated with each test point on the BGA. Each spring probe extends from the interior portion of the test socket in the compartment where the BGA is held through the bottom of the socket.

The test socket is used in connection with a printed circuit board (PCB) that is specially designed solely for testing the particular BGA. This special PCB has many names, for instance "load board" or "DUT board," the later meaning the "device under test board." The later naming convention is used herein. The DUT board has only one purpose, and that is to facilitate testing of a specific component. The DUT board electrically interfaces the component under test with the test machine that sends signals to the component.

As noted, the DUT board is specially designed to test a specific component such as a microprocessor die packaged in a BGA. The board typically has many different circuits and it may have many different electronic components. These vary depending upon the device under test and other factors relating to the testing regime. But the DUT board also always has a footprint of electrical pads on one outer surface of the board that matches the footprint of the spring probes that extend through the bottom of the test socket. In practice, the footprint pattern is drilled through the DUT board according to the array pattern of test points on the device under test. An electrically conductive pad is then deposited on one surface of the board according to well known PCB manufacturing techniques. Each pad is electrically connected through the associated hole and associated traces to other components and ultimately to the test machine interface.

Just as there are many types of test sockets, there are also many types of DUT boards. In some instances multiple DUT boards may be used in combination to test a component. In other instances, multiple DUT boards or other printed circuit boards may be combined in order to provide an interface with a testing machine so that one may vary the combination of boards and/or sockets.

In instances where multiple PCBs are interfaced, or stacked, the multiple boards are oriented adjacent one another. The interface between the two boards may be made with a spring probe holding plate oriented between the boards or through connectors. The spring probes probe respective associated pads on the facing surfaces of the board in order to transfer test signals from the test machine through selected circuits on the boards. But the interfaces between the boards results in an undesirable increased distance between the boards.

For purposes of further illustration, a typical test process involving adjacent PCBs will be described. In the following example the adjacent boards are referred to as the mother board and the daughter board. It will be understood that this example is for illustration only, and that a similar illustration may be made with other board to board interconnections, and with board to socket interconnects. Nonetheless, in this board to board situation mother board is mounted adjacent the daughter board such that the one end of each spring probe held in the probe plate is physically urged against a test pad on the mother board, and the opposite end of each probe is in contact with the associated pad on the daughter board. This compresses the spring probes to insure good electrical contact between the pads and the spring probes. The two adjacent boards are typically bolted to one another with the probe alignment plate sandwiched in between, resulting in physical and electrical contact between the boards through the spring probes. In this way there is an electrical connection established from the test machine through a variety of traces and components in the mother board, through the spring probes, and to the associated test points on the daughter board. This compressive load is referred to as "pre-load" compression.

The paired boards are then connected to a test machine, and the test machine can then begin sending test signals according to a preprogrammed testing routine to the boards to determine whether the boards meet specifications.

The electrical characteristics of the PCBs are important factors in the testing process since they are a potential source of irregularities in the electrical signals being transmitted between boards. Ideally, the electrical signals transmitted into between the boards should be flawless (i.e. "transparent") and free of electrical irregularities, often called parasitic components. By eliminating parasitic components and providing electrically pure signals, the test results obtained are a true measure of the performance of the component under test. On the other hand, when the test signals are contaminated with parasitic components, the test results may not provide the desired level of certainty in the performance of the device. While there is software available to correct for parasitic components, the better method is to eliminate such components.

As one example of a signal imperfection that can cause a fault error that should not have occurred, consider the situation described above with regard to voltage drops caused by signal imperfections.

The electrical dynamics associated with PCBs are highly complex, and there are several sources of electrical signal impurities such as capacitance, inductance, resistance and signal interference such as cross talk and distortion. One of the main sources of signal impurity is found in the spring probes that interconnect the boards. Generally speaking, as the electrical path from the test machine (or signal generator) gets shorter, the parasitic components in the signal are decreased. For example, capacitance and inductance are related to the length of the spring probe (among other factors). By decreasing the length of the spring probes, and therefore the length of the electrical path, capacitance and inductance are reduced and signal interference between adjacent pins is likewise reduced. It is beneficial, therefore, to shorten the probes as much as possible.

As another example of a signal imperfection, a condition called "skin effect" is a problem that occurs with high frequency test signals. Skin effect relates to the properties and electrical characteristics associated with electrical signals travelling up the outer surface of a spring probe and creating unusual, and undesired interference between the signals travelling through adjacent pins. The length of a spring probe is one factor that contributes to greater skin effect problems.

Spring probes can therefore be a significant source of signal impurities and can adversely effect test results. The spring probes are nonetheless necessary components since they ensure 100% electrical connection between the pads on adjacent boards. There is a need, therefore, for apparatus for improving the electrical characteristics of test signals sent through mother/daughter combinations while maintaining 100% compliance in connectivity.

SUMMARY OF THE INVENTION

The present invention provides an apparatus and method for significantly improving the speed at which test signals are transferred between PCBs, and for providing a signal that has improved electrical purity by reducing parasitic components such as capacitance and inductance. According to the present invention, spring probes are retained in the holes drilled in the board rather than in a probe alignment plate.

The present invention involves the use of multiple adjacent boards, for example a mother board and a daughter board, to either test a component that is retained in a socket attached to the daughter board or, for example, to interconnect one or both of the boards. In this case, spring probes are retained in the holes drilled in the mother board and make contact with associated test points on the facing surface of the adjacent daughter board, or vice versa. The spring probe is contained within the board itself. This is accomplished by forming the test pads on one or both of the boards as holes that electrically interface with spring probes received within the holes. For instance, the holes may be formed in the motherboard. The ends of the spring probes make physical and electrical contact with associated test points on the next adjacent board, the daughter board, which is held in far closer proximity to the motherboard than would be possible with a standard probe receiving plate or connector. In other words, the distance between the upper surface of the motherboard and the facing surface of the daughter board is significantly reduced. This eliminates a substantial distance through which test signals travel and significantly decreases parasitic components. The same principles may be applied to combinations of boards where each board has spring probes inserted into holes in the boards. Moreover, such boards may be used with sockets.

Alternately, a board using spring probes held within holes in the board may be used in combination with an adjacent dielectric material to modify the electrical characteristics sent through the probes.

The electrical connection between the spring probe and the modified "test pad" on the board can be established in several ways using standard trace techniques. As is typical with most PCBs, the board used with the present invention has multiple levels. The traces may connect to the spring probe holes at any level in the board. For instance, each hole in the footprint can be filled with solder, then partially drilled to leave a solder plug in the bottom of the hole. The solder plug, deep within the hole, replaces the pad on the outer surface of the board. Alternately, each hole may be filled at the lower end with a solder ball. Finally, the outer surface of the spring probe itself can be used to establish an electrical connection with a hole that is lined with electrically conductive material but open on opposite ends. To further reduce the adverse effects of parasitic components, ground planes may be placed around the trace in adjacent vertical layers of the board or horizontally next to each signal line.

BRIEF DESCRIPTION OF THE DRAWINGS

The invention will be better understood and its numerous objects and advantages will be apparent by reference to the following detailed description of the invention when taken in conjunction with the following drawings.

DETAILED DESCRIPTION OF PREFERRED EMBODIMENTS

Figure 1:
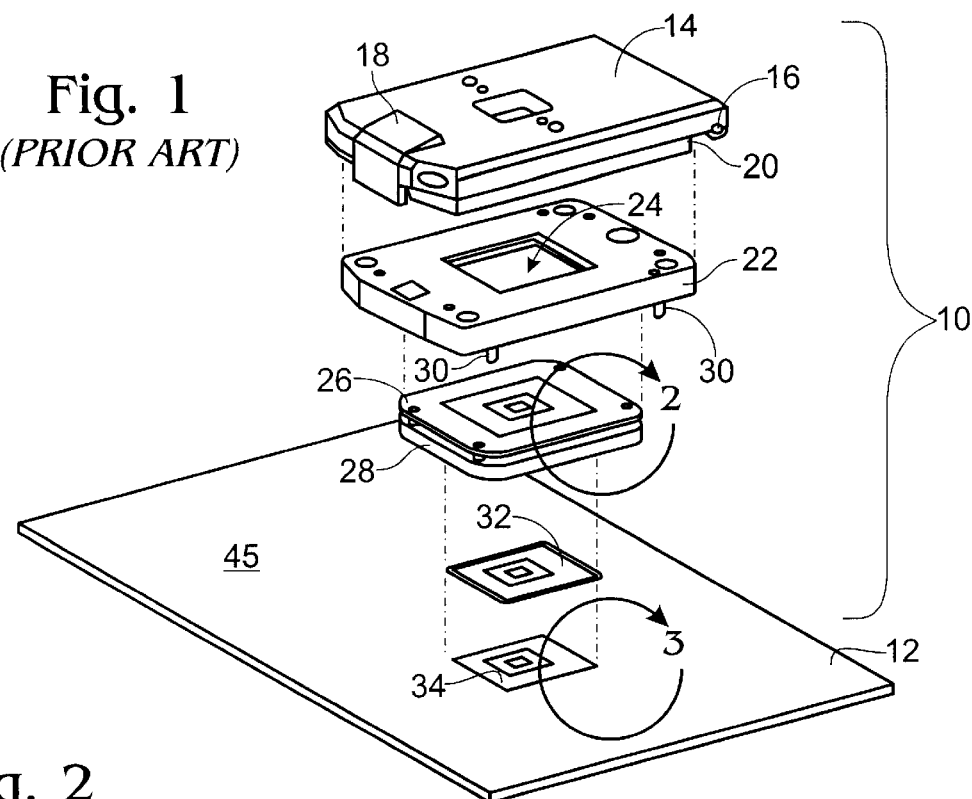
FIG. 1 is a perspective partially schematic view illustrating a prior art test socket, which is partially exploded, and a DUT board to which the test socket is attached.

For background purposes a prior art test socket 10 is shown in a partially schematic, exploded view in FIG. 1. Test socket 10 includes various component parts that are assembled in the manner described below to form a hinged container having an internal compartment for holding an electronic component that is to be tested (sometimes referred to as the "part" being tested). Although the term "component" is used herein to refer to a part such as an integrated circuit held in a die such as a BGA, "component" also refers to PCBs. The assembled test pocket is attached to the DUT board 12. DUT board 12 is shown schematically in the figures but will be understood to be a printed circuit board having a plurality of electronic components designed for testing a specific device under test. Traces within the board connect with a test machine interface on the board so that the board may be electrically connected to a test machine or signal generator, which transmitting test signals to the electronic component received in test socket 10. The testing regime is a complex process run by software and which sends test signals to the device under test according to a predetermine sequence.

There are many different types of test sockets available. For reference purposes, test socket 10 shown in FIG. 1 includes a lid 14 having a hinge 16 at one end and a latch 18 at the opposite end. A hinge plate 20 underlies lid 14 and is hinged thereto. Hinge plate 20 includes a central opening (not shown) called a window, which in turn receives a pusher plate that functions to exert downward pressure on an electronic component held in the test socket. A socket body plate 22 underlies the hinge plate and is aligned with it such that a central window 24 in the socket body aligns with the pusher plate when the test socket is closed with latch 18, securing the socket in the closed position. Socket body plate 22 is fixed to the underside of hinge plate 20 such that when connected, hinge plate 20 is allowed to pivot upwardly about hinge 16, thereby providing access to the window in hinge plate 20 and aligned window 24. Window 24, like the rest of the components of the test socket, is sized to receive a specific electronic component such as a BGA package. As such, window 24 may be of virtually any size and shape corresponding to the specific part being tested.

An alignment plate 26 and a probe plate 28 immediately underlie socket body plate 22 and are aligned therewith. As described in detail below, alignment plate 26 functions to align the plural test points on the electronic component that is being tested with an associated like number of holes drilled through the underlying probe plate 28. These plates are aligned with respect to one another with alignment pins 30 that are spaced around the periphery of the plates and extend through openings in the plates. A retainer sheet 32 is interposed between the lowermost surface of probe plate 28 between the probe plate and an array of test points 34, also known as a "footprint," on DUT board 14. Retainer sheet 34 is well known in the art and typically comprises a latex sheet or finely woven sheet of material that functions to hold a plurality of test probes in position in the probe plate.

Figure 2:
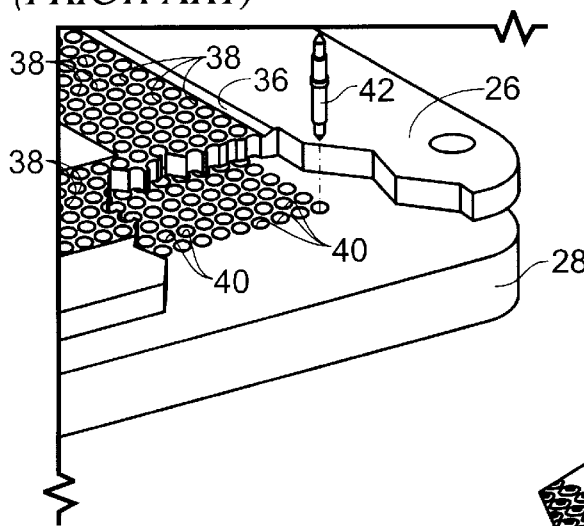
FIG. 2 is a perspective enlarged view of the close up circle 2 of FIG. 1, showing a partial sectional view through the pin alignment plate of the test socket.
Figure 3:
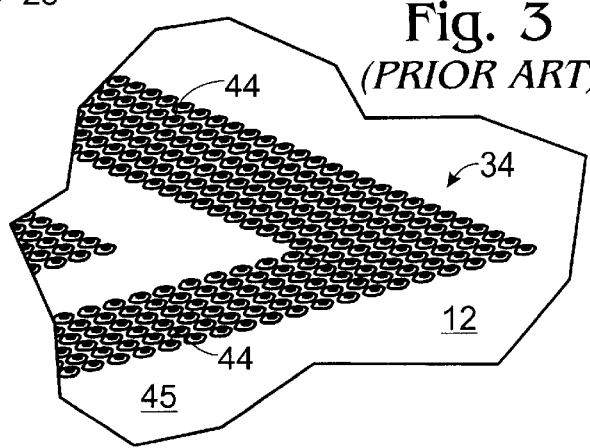
FIG. 3 is a perspective enlarged view of the close up circle 3 of FIG. 1 showing a portion of the footprint array of test points on the DUT board.

The close up circle shown in FIG. 2 details a corner portion of alignment plate 26 and probe plate 28. Alignment plate 26 is designed to receive a specific electronic component within a central section of the plate. In the example shown in FIG. 2, the central section of the alignment plate is defined by an angled shoulder 36 that extends peripherally around a plurality of alignment holes 38. As noted, the test socket is designed to receive and test only one specific electronic component. The test socket shown in FIGS. 1 through 3 is exemplary of a test socket that is designed to test, for example, a BGA package. The number and position of alignment holes 38 in alignment plate 26 corresponds with the number and position of test contacts or test points on the electronic component. Of course, the number and placement of test contacts on any given electronic component varies widely. Accordingly, the number and position of alignment holes varies in a like manner. Similarly, the function of shoulder 36 is to cooperate with other components of the test socket to retain the electronic component under test within the test socket such that each test point on the component remains in precise alignment with an associated alignment hole 38. As such, the shape and design of shoulder 34 varies with the component under test.

There is a test probe receiving hole 40 in probe plate 28 aligned with each alignment hole 38 in alignment plate 26. A spring probe 42 is inserted into each test probe receiving hole 40. As noted above, there are many kinds of spring probes available for use in test sockets. The spring probe 42 shown in FIG. 2 is representative only of the many different kinds of probes that might be used in a given situation. Probe 42 includes a hollow central tube that is loaded with a resilient and conductive spring. A plunger is slidably inserted into each opposite end of the central tube with each end of the spring making contact with a plunger and is retained within the tube to prevent the plungers from sliding out of the tube. This gives the probe the ability to be extendable between compressed positions and extended positions. The lower end of each spring probe 42 extends through the lower surface of probe block 28 and through retainer sheet 32, which keeps the spring probes from falling out of the probe block. The upper ends of each spring probe extend into the associated alignment hole 38 in alignment plate 26.

A portion of the array of circuit pads (also referred to as test pads) in footprint 34 is shown in the close up circle of FIG. 3. As may be seen, footprint 34 comprises a plurality of circuit pads 44 on upper surface 45 of DUT board 12. The plurality of pads 44 are arranged in an array pattern that corresponds to the array pattern of test points on the component under test. The upper surface 45 is that surface of the board that faces the test socket when these two components are assembled. DUT board 12, as noted above, is a printed circuit board and it has multiple layers. Each circuit pad 44 is electrically interconnected through traces, and circuitry in the DUT board, to a test machine interface on the board. These traces and circuitry, and the manner of interfacing the circuit pads 44 with the test machine interface are well known in the art and are not shown in the figures. The test machine interface allows for electrical connection of the board to the test machine. For each test point on the electronic component under test there is an associated alignment hole 38 in alignment plate 26, an associated aligned test probe receiving hole 40 in test plate 28, and an associated circuit pad 44 in footprint 34. In other words, there is a circuit pad 44 associated with each test point in the electronic component under test.

In many instances, circuit pads 44 comprise an oval disk of electrically conductive material deposited onto surface 45 of DUT board 12 that faces test socket 10. DUT board 12 is built with circuitry specifically designed to test the electronic component under test. For each circuit pad 44 there is a hole drilled through the circuit board material. These holes are filled with electrically conductive core materials such as solder, and circuit pad 44 is electrically connected to the solder. An electrical trace is made to each of the solder cores to connect each circuit pad with the test machine interface.

With a spring probe loaded into each hole in the probe plate, the test socket is physically attached to the DUT board such that each circuit pad 44 aligns with an associated spring probe. The test socket may be attached in any convenient manner, such as with screws. This puts the spring probes under a pre-load compression in which the lower plungers are urged against the associated circuit pads 44 on the DUT board. The spring probe body is fixed in the probe receiving hole at all times.

Once the socket is pre-loaded by attaching it to the DUT board, an electronic component is then loaded into the receiving window in the test socket and lid 14 is closed and latched into the closed position. Closing the lid results in the electronic component being forced downwardly in the socket, causing the upper distal ends of the spring probes to make physical and electrical contact with the associated test points on the electronic component. The upper plunger of each spring probe is further compressed into the body of the spring probe during this operation (the body of the spring probe is fixed in the probe receiving hole), further compressing the spring that resides within the probe body.

With the test socket attached to a DUT board and in the closed, compressed condition, the uppermost end of the spring probes extend upwardly through the associated alignment holes 38 in alignment plate 26 and make physical contact with an associated test pad on the I component held in the test socket (not shown). The lowermost distal end of each spring probe makes physical contact with the associated circuit pad 44 in footprint 34, and on upper surface 45 of DUT board 12.

With the electrical contacts thus made the combination of the DUT board and loaded test socket may be interfaced with the test machine. The test machine runs electrical tests on electronic component 50 by sending test signals through the traces through the DUT board, through the spring probes to desired test points on component 50.

It will be appreciated that the example of a prior art test socket described above is for illustration purposes only, and that there are many variations in the kinds of test sockets and in the kinds of spring probes that are used with them. However, in all known prior art test sockets, the spring probes reside in positions above the circuit pads on the DUT board, for instance within a probe plate in a test socket, and such that the lower ends of the probes contact circuit pads located on an upper surface of the DUT board and the opposite, upper ends of the probes contact the associated test points on the part that is being tested.

Having described the prior art, the present invention will now be described with reference to a preferred embodiment. The present invention decreases significantly the effective distance that an electrical signal must travel from the board to the part being tested, which in this case is an adjacent board. It will be appreciated that a trace is electrically connected to each hole in the board in the standard manner. However, ground planes may be used to shield the trace where it interconnects with the electrically conductive material that resides in the hole. The ground planes decrease electrical interaction between adjacent traces and test pads in the DUT board, and hence further decrease the effect of parasitic components.

As noted above, components may be tested with apparatus that includes multiple printed circuit boards. Such an apparatus is shown schematically in FIG. 4, which includes a lower mother board 100 and an adjacent upper board, or daughter board 102. It will be appreciated that each board is a printed circuit board that is designed for a specific task, and as such that each board typically will include plural layers fabricated according to known techniques for manufacturing PCBs. FIG. 5 illustrates schematically that mother board 100 includes multiple layers of material.

Figure 4:
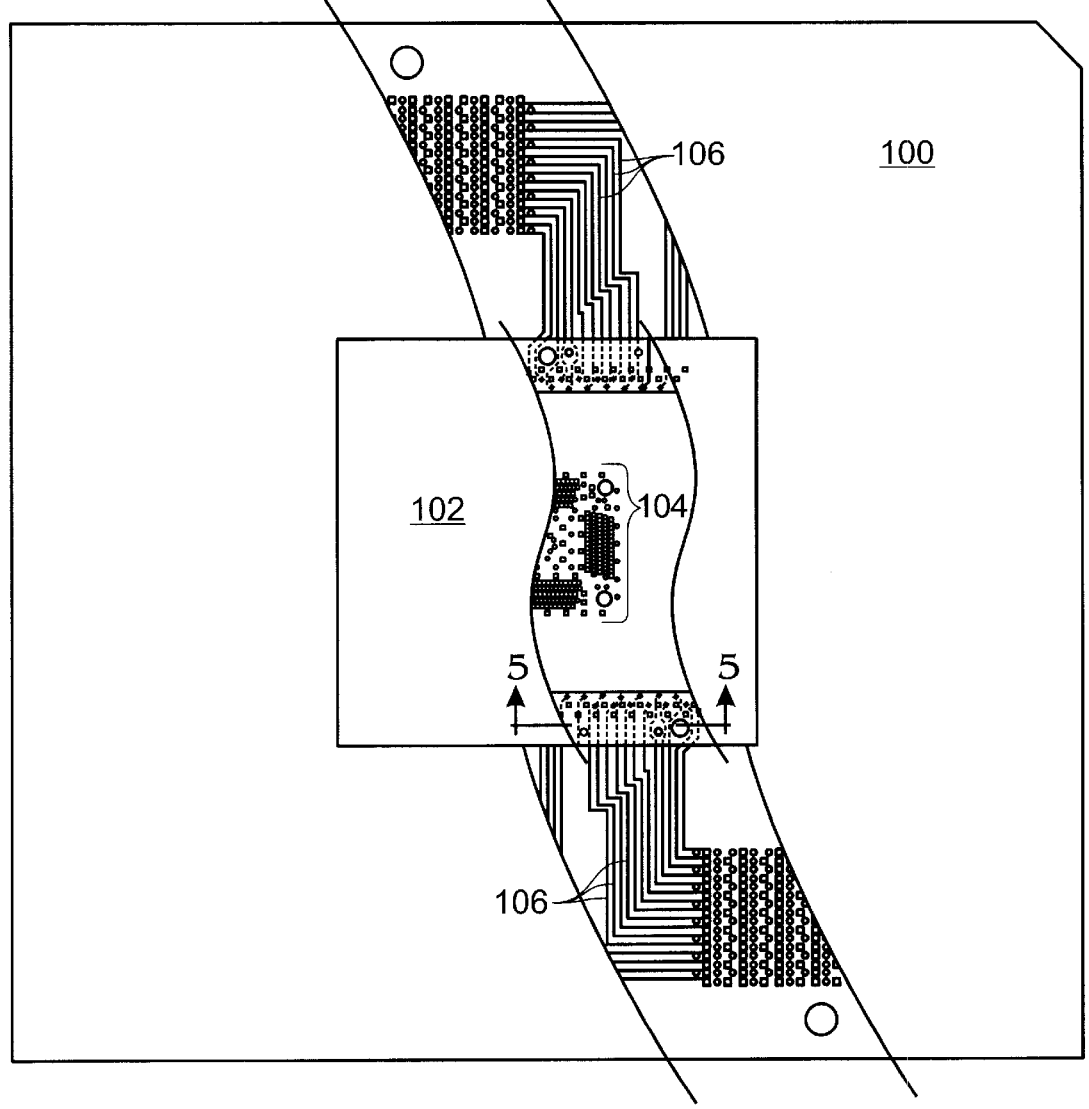
FIG. 4 is a plan view of a schematic combination of a pair of boards stacked atop one another.
Figure 5:
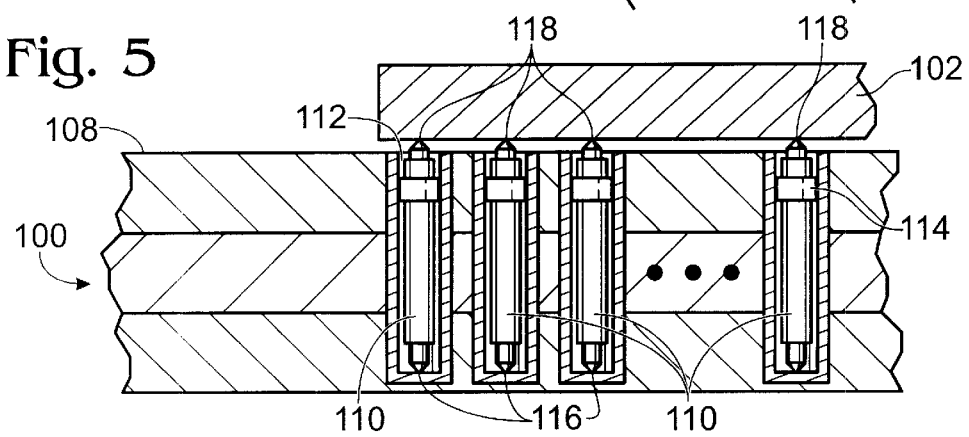
FIG. 5 is a partial cross sectional and schematic view taken along the line 5—5 of FIG. 4 and illustrating various board to board spring probe connections.

Multiple PCBs such as those shown in FIG. 4 may be combined with either a traditional test socket, or one modified according to the principals of the present invention. For example, the high density region 104 that is shown in the central portion of daughter board 102 is adapted for testing a specific component such as a BGA package and thus has a corresponding plurality of test points arranged in an array pattern that corresponds to the test points on a BGA package. However, multiple PCBs may be combined as described herein for purposes other than testing separate components. For example, the boards may be used to test the electrical properties and circuitry of adjacent boards. The PCBs therefore are also referred to herein as "components." Also, with reference to FIG. 4 it will be appreciated that the circuitry shown in the figure is illustrative only, and partial at that. Thus, an actual board would include more circuitry and additional traces. However, for illustrative purposes, it will be appreciated that the electrical traces 106 across the upper surface 108 of mother board 100 each represent a discrete electrical signal path that runs between the mother board and daughter board 102. The board to board interconnection between the two boards is achieved by way of spring probes. The number and pattern of test probes depends upon the specific circuits that are being tested and connections required, and other considerations. Typically, the mother board 100 would be interfaced through known means to a test machine that is configured for transmitting the test signals through the mother board and thus the test probes, to selected circuits.

Referring to FIG. 5, four separate spring probes 110 are shown in mother board 100. Each probe is a standard double-ended spring probe that has a separately compressible probe extending out the opposite ends of a plunger tube that contains and encloses the spring. Each spring probe 110 is inserted into an opening or hole 112 formed in upper surface 108 of board 100. Each opening is formed in the manner described above, or alternately could be formed with an electrically conductive cylindrical sleeve inserted into the opening in the board. As described above, each spring probe makes electrical contact with the electrically conductive material lining the opening, for instance with the enlarged band 114 that encircles the probes. The lower ends 116 of each probe 110 probes the closed lower ends of the openings, while the upper ends 118 of each probe make electrical connections with associated test pads on the adjacent daughter board 102. It will be appreciated that the mother board will be electrically interfaced with a test machine or with another test board in order to generate signals that are transmitted to and through the probes, although those interconnections are not shown for the sake of simplicity in the figures. It also will be appreciated that with this structure the two boards, mother 100 and daughter 102 are in much closer proximity to one another than they would be if a prove-receiving plate were used to hold the spring probes. This shortens the electrical path and results in a cleaner signal with less parasitic components, and in higher speeds.

Figure 6:
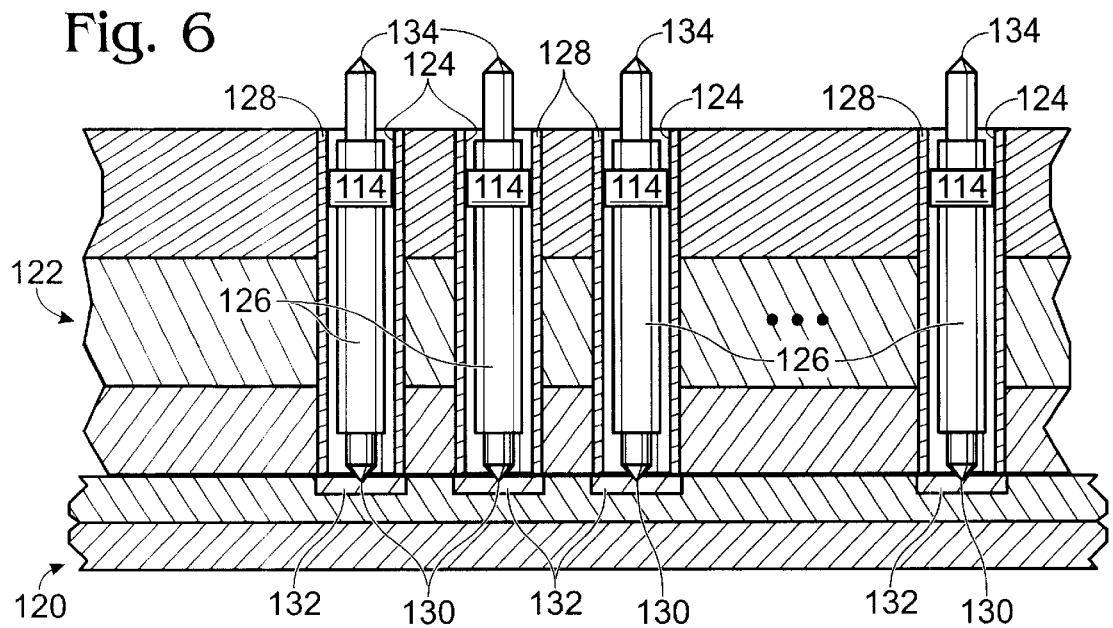
FIG. 6 is a partial cross sectional and schematic view similar to FIG. 5 but illustrating alternative embodiments of printed circuit board to printed circuit board spring probe connections.

An alternate arrangement of a printed circuit board to printed circuit board interface with spring probes is shown in FIG. 6. There, two multi-layer boards, mother board 120 and daughter board 122 are shown adjacent one another. In this case, daughter board 122 includes plural openings 124 that extend completely through the board and thus define passageways through the board. Each passageway or opening 124 contains a spring probe 126. The openings are formed as described above and include electrically conductive linings 128. However, as noted, the lower ends of openings 124 (that is, the ends of the openings between the two boards) are open and the lower distal ends 130 of spring probes 126 make electrical contact with associated pads 132 on mother board 120. The adjacent mother and daughter boards may be used for numerous purposes, such as power and ground. It will be understood that the upper ends 134 of probes 126 may be used to probe associated points on a socket (as described above) or associated test points on yet another adjacent board.

Figure 7:
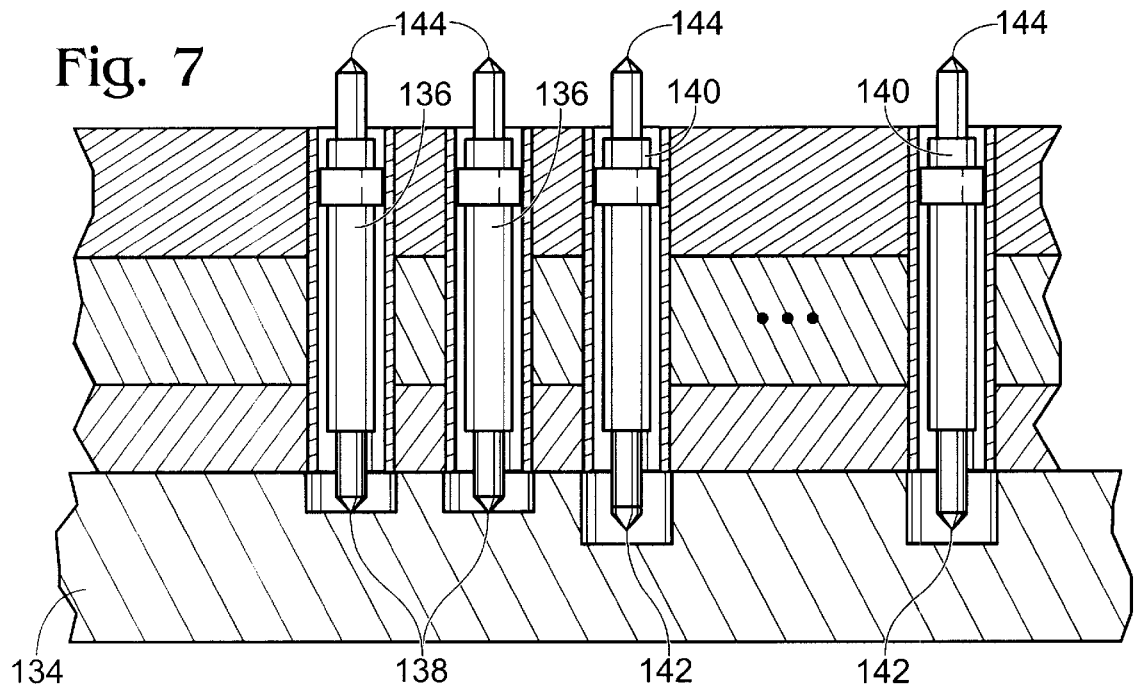
FIG. 7 is a partial cross sectional and schematic view similar to FIG. 6 but showing a printed circuit board to dielectric layer with associated spring probe interconnections.

Yet another alternate structure is shown in FIG. 7, where the lowermost board has been replaced with a plate 134 that may be various materials according to the desired result. For instance, plate 134 could be a dielectric material or a conductor. Depending upon the desired properties and signal properties, the probes may either make contact with plate 134 such as is shown with probes 136 where lower ends 138 of the probes make contact with the plate. Where plate 134 is a ground/shield and the probes make contact with the plate, the plate acts as a capacitor. As in the case of probes 140, the probes may also extend into but not contact plate 134. Thus, the lower ends 142 of probes 140 do not contact plate 134. If plate 134 is a ground/shield and the probes do not contact the plate, then the structure shown in FIG. 7 creates a coaxial environment and atmosphere at the lower ends of the probes, but without an associated increase in the thickness of the plate. The coaxial environment is a desirable electrical characteristic in some circumstances. As noted above, It will be understood that the upper ends 144 of probes 136 and 140 may be used to probe associated points on a socket (as described above) or associated test points on yet another adjacent board.

The holes 112 in board 100 may be formed in any number of ways. For example, the holes drilled through the board may be filled with electrically conductive material such as solder such that the solder lines each hole, leaving an open center cylinder. For example, the solder may be deposited in the holes such that the solder coats only the interior of the holes but does not completely fill the holes. Alternately, the holes may be completely filled with solder as is done in the prior art, and the solder may then be removed from a center portion of the filled holes to form cylindrical holes in the pads. With the holes filled completely with solder, a hole may be drilled completely through the solder, as shown with respect to the holes illustrated in FIG. 7. Alternately, the holes may be drilled only partially through the core solder material.

The holes formed in this manner define upwardly open cylindrical cores for receiving spring probes. This is illustrated in FIGS. 5, 6 and 7, where a spring probe is received into the core associated with each pad in the footprint. The uppermost ends of the spring probes extend above the surface of the board and are in position to make direct, physical contact with the associated test points on adjacent daughter board.

Each test pad in the footprint array of test pads on mother board 100 is electrically connected through a trace to an interface that connects the board to the test machine. Although in the drawings the mother board is shown greatly simplified with only 3 layers, those skilled in the art recognize that the board will have many more layers, perhaps many dozens. The traces interconnect with the test pads at various levels in the board, depending upon board design. Because the test probes make physical contact with the electrically conductive material that lines the holes 112 in board 100, there is an electrical connection from the trace, through the electrically conductive material in the test pads, and into and through the test probes.

It is readily evident that the present invention allows the mother board to be moved into much closer physical proximity to the daughter board than with the prior art probe alignment plates. By decreasing this distance, the electrical purity of the signals transmitted to the component under test is vastly improved, and parasitic electrical components such as capacitance and inductance are decreased. At higher frequency testing, skin effect is decreased due to the shorter electrical path. Moreover, because the separation distance between the boards and/or the board and a component held in a socket is greatly decreased, the speed with which test signals run between boards of from a board to a part being tested is increased proportionately with the decrease in distance. The "speed" of the test signals, which is typically expressed as a frequency in Hz, may be increased by as much as 75% and more over traditional test sockets.

While the present invention has been described in terms of the best mode of a preferred embodiment, it will be appreciated by one of ordinary skill that the spirit and scope of the invention is not limited to those embodiments, but extend to the various modifications and equivalents as defined in the appended claims.

I claim:

1. An electronic component test interface comprising:
   a first PCB having opposed upper and lower surfaces and a plurality of test points arranged in a pattern on the upper surface, each of said test points defined by an opening extending from said upper surface into said first PCB;
   a spring probe received in each opening, each spring probe having a proximate end and a distal end, wherein the distal end of each test spring probe extends beyond said upper surface;
   a second PCB positioned adjacent said upper surface of said first PCB such that the distal end of each spring probe is in a position to establish an electrical connection with an associated test point on said second PCB.

2. The electronic component test interface of claim 1 wherein each opening extends through said lower surface to define a passageway through said first PCB, and wherein the proximate end of each spring probe extends beyond said lower surface and is in a position to establish an electrical connection with an associated test point on a PCB positioned adjacent said lower surface.

3. The electronic component test interface of claim 2 wherein said PCB positioned adjacent said lower surface defines a conductor plate or ground plate positioned adjacent said lower surface, the conductor plate having an opening in the surface thereof corresponding to each spring probe, and wherein the proximate end of each spring probe extends beyond said lower surface of said first PCB and into the corresponding opening in said conductor plate but does not make contact with said conductor plate.

4. The electronic component test interface of claim 1 wherein each opening extends through said lower surface of said first PCB to define a passageway through said first PCB, and wherein said second PCB positioned adjacent said lower surface defines a shielding plate positioned adjacent said lower surface, the shielding plate having an opening in the surface thereof corresponding to each spring probe, and wherein the proximate end of each spring probe extends beyond said lower surface of said first PCB and into the corresponding opening in said shielding plate but does not make contact with said shielding plate.

5. The electronic component test interface of claim 3 wherein said conductor plate creates a coaxial environment at the proximate end of each spring probe.

6. The electronic component test interface of claim 1 wherein each opening extends through said lower surface of said first PCB to define a passageway through said first PCB, and wherein the proximate end of each spring probe extends beyond said lower surface of said first PCB and contacts a dielectric member positioned adjacent said lower surface.

7. The electronic component test interface of claim 1 including a test socket configured for receiving an electronic component having a plurality of test points, said test socket attachable to said first PCB such that each test point in said plurality of test points on said component is associated with a test point on said first PCB and such that the distal ends of said spring probes make electrical contact with an associated test point on said component.

8. An electronic component test interface comprising:
a printed circuit board having opposed upper and lower surfaces and a plurality of test points arranged in a pattern on a surface of said board, each of said test points defining a passageway extending through said board;
a spring probe received in each passageway, each spring probe having opposite ends and each spring probe received in a passageway such that the opposite ends of each probe extend beyond said respective upper and lower surfaces;
a first electronic component positioned adjacent said upper surface and a second electronic component positioned adjacent said lower surface, each of said first and second electronic components having plural test points, and wherein the first end of each spring probe makes an electrical contact with an associated test point on said first electronic component and the second end of each spring probe makes an electrical contact with an associated test point on said second electronic component.

9. The electronic component interface of claim 8 including a test socket configured for receiving an electronic component having a plurality of test points arranged in a pattern, said test socket attachable to said upper surface of said printed circuit board such that each test point in said plurality of test points on said component is associated with a test point on said printed circuit board and such that one end of each spring probe makes electrical contact with an associated test point on said component.

10. The electronic component interface of claim 8 wherein the first electronic component comprises a printed circuit board.

11. The electronic component interface of claim 8 wherein the second electronic component comprises a printed circuit board.

12. The electronic component interface of claim 8 wherein the second electronic component comprises a conductor.

13. The electronic component interface of claim 8 wherein the second electronic component comprises a dielectric material.

14. Apparatus for use in an electronic component test interface comprising:
a printed circuit board having opposed upper and lower surfaces and a plurality of test points arranged in a pattern on a surface of said printed circuit board, each of said test points in said plurality of test points defining an opening extending from said upper surface into said printed circuit board to thereby define plural openings;
a double-ended spring probe received in each of said openings, each double-ended spring probe having a proximate end and a distal end and each double-ended spring probe received in an opening such that the distal end extends beyond said upper surface.

15. The apparatus according to claim 14 where at least some of said openings further comprise passageways through said printed circuit board through which the proximate ends of said double-ended spring probes extend beyond said lower surface.

16. The printed circuit board according to claim 14 in which the distal ends of said double-ended spring probes make physical and electrical contact with associated test points on an electronic component.

17. The printed circuit board according to claim 15 in which the proximate ends of said plurality of double-ended spring probes make physical and electrical contact with associated test points on an electronic component.

18. The printed circuit board according to claim 17 in which the electronic component comprises a conductor.

19. The printed circuit board according to claim 17 in which the electronic component comprises a dielectric.

\* \* \* \* \*